United States Patent [19]
Scott

[11] 4,093,988
[45] June 6, 1978

[54] HIGH SPEED FREQUENCY RESPONSE MEASUREMENT

[75] Inventor: Paul F. Scott, Niskayuna, N.Y.

[73] Assignee: General Electric Company, Schenectady, N.Y.

[21] Appl. No.: 739,628

[22] Filed: Nov. 8, 1976

[51] Int. Cl.² ............................................. G06F 15/34
[52] U.S. Cl. .................... 364/484; 324/77 B; 364/726; 364/579; 364/572
[58] Field of Search ............... 235/151.31, 152, 156, 235/151.3, 150.3; 324/77 B, 73 R, 73 AT

[56] References Cited

U.S. PATENT DOCUMENTS

| | | | |
|---|---|---|---|
| 3,506,962 | 4/1970 | Brenner | 235/151.31 X |
| 3,529,140 | 9/1970 | Doering | 235/151.31 |
| 3,694,643 | 9/1972 | Smith | 235/150.3 X |
| 3,764,995 | 10/1973 | Helf, et al. | 235/151.31 X |
| 3,780,274 | 12/1973 | Thompson, et al. | 235/151.31 |
| 3,932,737 | 1/1976 | Delépine | 324/77 B X |
| 3,984,770 | 10/1976 | Chu | 235/151.31 X |

*Primary Examiner*—Edward J. Wise
*Attorney, Agent, or Firm*—Donald R. Campbell; Joseph T. Cohen; Marvin Snyder

[57] ABSTRACT

A binary pseudo-random sequence generated by a shift register with feedback is used as a noise signal for testing an electrical or mechanical system, and the output is sampled and the power spectra computed by discrete Fast Fourier Transform techniques. The sequence bit interval and sampling interval have a predetermined ratio, and either the noise signal or output test signal is low pass filtered, with the result that closely spaced equal amplitude sine waves are effectively applied to the system under test and their responses separated at the output with no statistical uncertainty.

6 Claims, 5 Drawing Figures

$$f = \frac{1}{\Delta T_{seq.}}$$

$$\Delta f = \frac{1}{(2^N-1)\Delta T_{seq.}}$$

HIGH SPEED FREQUENCY RESPONSE MEASUREMENT

BACKGROUND OF THE INVENTION

This invention relates to a method for the high speed measurement of the frequency response of a linear system, and more particularly to frequency response measurement in which a binary pseudo-random noise sequence is applied to the linear system and the power spectra of the output is determined directly by Fast Fourier Transform (FFT) techniques.

The magnitude of the transfer function or amplitude of the frequency response of a linear system is an important parameter in system design. Because it is the fundamental specification in many electrical and mechanical systems, such as filters, amplifiers, radio receivers, and vibrating mechanical equipment, its determination from the physical system is important for both diagnostic and analytical reasons. There are two basic methods for accomplishing this measurement. One technique is to inject successive sinusoidal excitations at different frequencies into the system and measure the magnitude of the response of each. Another technique involves applying random inputs to the system and analyzing the random output, and includes injecting white noise into the system under test and analyzing the output with a narrow filter band set. Both of these techniques have disadvantages if the measurement is to be made rapidly with a high degree of frequency resolution. In the former, the system must reach steady state for each excitation, and many measurements must be made to achieve good frequency resolution. In the latter, sufficient averaging time is required to obtain enough certainty in the measurement because the output is statistically random, and a tight filter set is needed for the specific method given.

Although either of the foregoing techniques can supply a reliable, high resolution measurement of the frequency response of an unknown system being tested, the time required to make the measurement is often excessive. This problem arises if the measurement is to be made on a high speed production line as a part of a quality assurance check or if the frequency response of the system is changing with time.

SUMMARY OF THE INVENTION

In accordance with the invention, the properties of binary pseudo-random noise and the discrete Fast Fourier Transform are utilized to, in effect, inject simultaneously a closely spaced set of equal amplitude sine waves over a prescribed frequency range into the system under the test and separate their response at the output. The test system must reach steady state as to only one input signal, there is no statistical uncertainty except as to noise, and equipment requirements are minimal.

In practicing the method, the initial step is deriving a binary sequence generator bit shift signal having a first frequency and a sampling actuating signal having a second frequency, with the first and second frequencies being selected to achieve a predetermined ratio between the sequence bit interval and the sampling interval of the output test signal. This ratio depends on the period and number of cycles of the pseudo-random noise sequence and the length of the FFT data block. The bit shift signal is applied to a digital shift register with feedback or other sequence generator to produce at the output thereof a binary periodic noise signal representing the binary pseudo-random sequence with a period given $(2^N - 1)\Delta T_{seq}$, where N is an integer and $\Delta T_{seq}$ is the sequence bit interval. The binary periodic noise signal is low pass filtered to retain frequency components with a substantially equal amplitude, then applied to the system under test. The output test signal is now sampled at a rate determined by the sampling actuating signal and the analog data samples converted to digital form, from which the power spectra is computed by a Fast Fourier Transform method. The foregoing method is suitable for electrical test systems, while for mechanical systems it may be preferable to supply the binary pseudo-random noise signal directly to the system under test and low pass filter the output test signal. The computed power spectra takes the shape of the frequency response and can be displayed in predetermined form.

DESCRIPTION OF THE PREFERRED EMBODIMENTS

Figure 5:
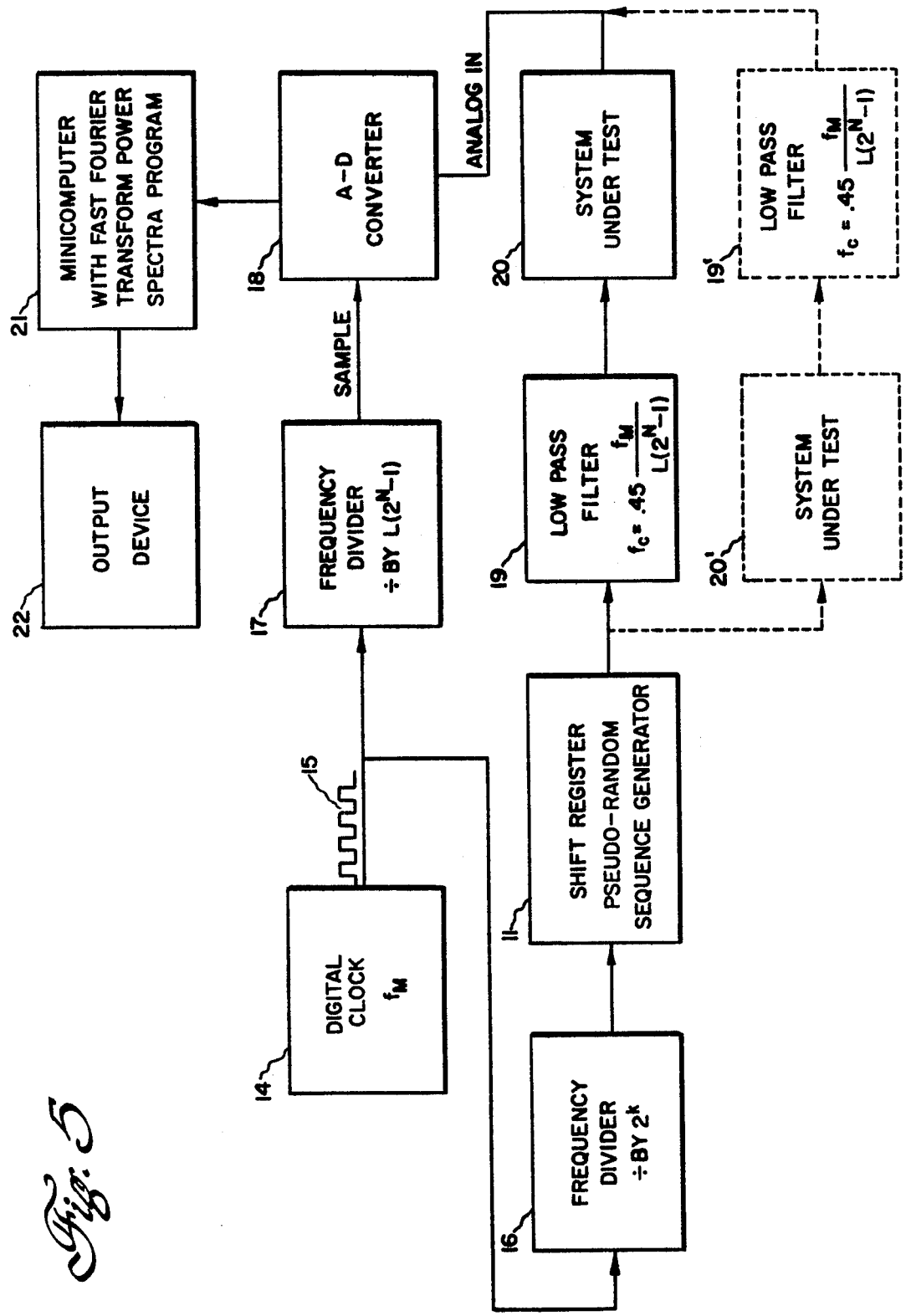
FIG. 5 is a block diagram of one embodiment of a test apparatus for performing high speed frequency response measurements as herein taught, showing in full lines the arrangement of the low pass filter and test system for electrical systems and in dashed lines the arrangement for mechanical systems.

The test apparatus for high speed frequency response measurement in FIG. 5 includes a pseudo-random sequence generator for generating a binary periodic noise signal which is low pass filtered and applied to the system under test, and also a minicomputer with a Fast Fourier Transform power spectra program. The operating frequency of the sequence generator and the sampling frequency of the output test signal providing data samples to the minicomputer are coordinated and have a predetermined ratio. This ratio, as will be developed later, depends upon the period of the noise signal generated by the sequence generator, the number of periods of the pseudo-random sequence, and the length of the data block or the total number of the data samples supplied to the Fast Fourier Transform minicomputer.

Figure 1:
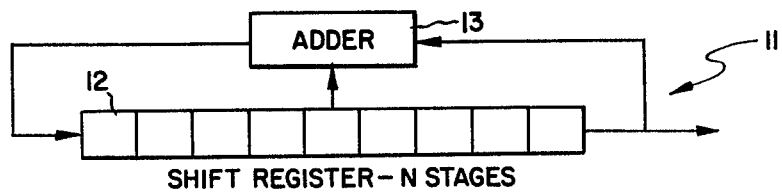
FIG. 1 is a block diagram of a digital shift-register sequence generator for generating a binary pseudo-random sequence.

The pseudo-random sequence generator in the preferred form of the invention is a digital shift register sequence generator such as is shown schematically in FIG. 1 and indicated generally at 11. This digital sequence generator is comprised of a N-stage shift register 12, provided with feedback from the output and from a designated intermediate stage to an adder 13 which, in turn, feeds back to the register input. The maximum period length obtained with feedback of this type is $2^N - 1$ bits, since a N-bit shift register can have $2^N$ different states but the all-zero state is not counted. This means simply that the sequence of binary digits in shift register 12 is different during the period length and repeats itself during successive cycles. For a nine-stage shift register, $N = 9$, feedback is from either the fourth or fifth intermediate shift register stage, and the period length is 511 bits. The binary digits are either 0, 1; or +1, −1 depending on the type of adder.

Figure 2:
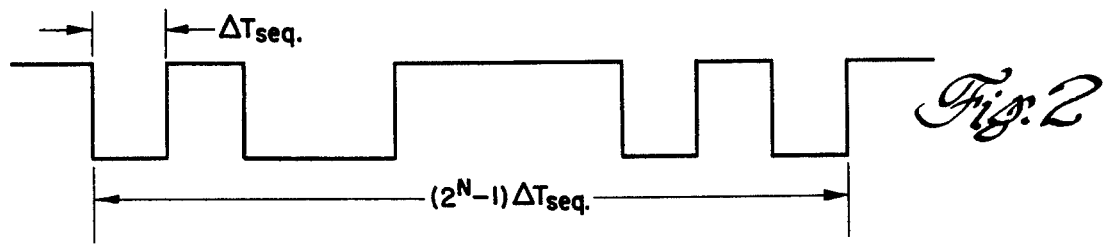
FIG. 2 is an exemplary waveform diagram of a binary periodic noise signal produced by the generator in FIG. 1.
Figure 3:
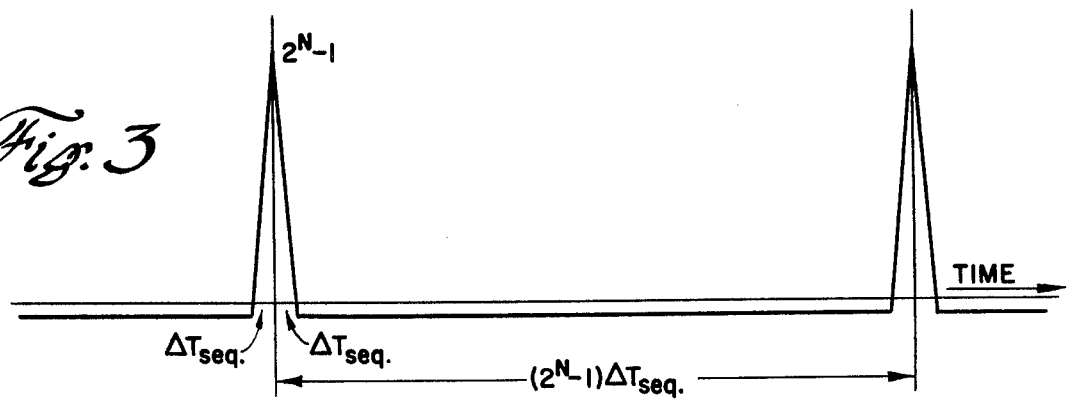
FIG. 3 shows the autocorrelation function of the binary pseudo-random sequence.

FIG. 2 shows an exemplary binary periodic noise signal generated at the output of digital shift register sequence generator 11. The sequence bit interval $\Delta T_{seq}$ is determined by the frequency of the clock pulses applied to shift register 12. The noise signal or binary pseudo-random noise sequence has a period given by $(2^N-1)\Delta T_{seq}$, where N is an integer. The binary periodic noise signal can be said to comprise a plurality of square or rectangular wave components of different lengths generated in pseudo-random fashion within each period. The autocorrelation function of the pseudo-random noise signal is depicted in FIG. 3. The autocorrelation function is characterized by triangular peaks centered about the dividing line between successive cycles and having a peak amplitude equal to $2^N-1$ and a one-half base length equal to $\Delta T_{seq}$. These triangular peaks recur at the sequence period given by $(2^N-1)\Delta T_{seq}$, and the autocorrelation function at other times has a small negative value. For further information on the foregoing, reference may be made to the book entitled "Random Process Simulation and Measurement," by Granino A. Korn, McGraw-Hill Book Company, New York, copyright 1966, Library of Congress Catalog Card No. 6524525.

Figure 4:
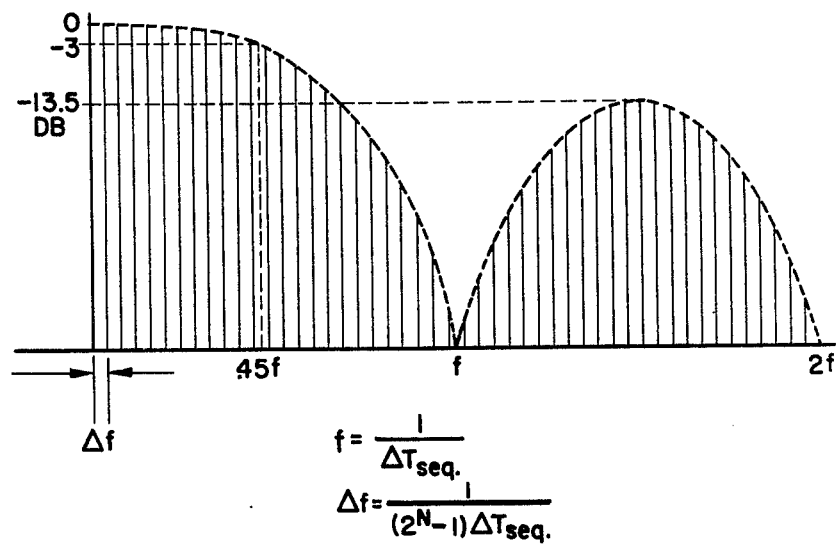
FIG. 4 shows the power spectra of the binary pseudo-random sequence.

Referring to FIG. 4, the power spectra of the binary pseudo-random noise sequence, because of the triangular peaks in the autocorrelation function, exhibits a lobed pattern with a major lobe and side lobes of successively decreasing amplitude. The first null between the major and first side lobe occurs at the fundamental frequency $f$, and other nulls occur at harmonic frequencies. The fundamental frequency is given by $$f = 1/\Delta T_{seq}. \quad (1)$$

The individual spectral lines in the power spectra occur at equal frequency increments defined by $$\Delta f = 1/(2^N-1)\Delta T_{seq}. \quad (2)$$

It will also be noted in FIG. 4 that up to approximately the −3 dB or half power point corresponding to approximately 0.45f, all of the sinusoids have approximately the same amplitude. As was mentioned, the first null occurs at $f$, while the peak amplitude of the first side lobe rolls off to −13.5 dB.

With this background, the theory underlying the present high speed method for measuring the frequency response of linear systems can be explained. It has been shown that the binary pseudo-random noise sequence with a maximum period length of $2^N-1$ bits has an autocorrelation function as in FIG. 3 and possesses a power spectra as shown in FIG. 4. It is important to note that the result for the autocorrelation function and thus the power spectra is only achieved when it is computed over the entire infinite sequence or circularly over an integral multiple of a period of $2^N-1$ bits. That is, an integral number of cycles of the pseudo-random sequence must be used. The discrete Fourier Transform of a sampled data block may be rapidly computed by the Fast Fourier technique in a minicomputer. When the data is analyzed in this manner, a block of $2^k$ points is used so that the algorithm can make maximum effectiveness of the computer's binary structure. A power spectra computed from the discrete Fourier Transform coefficients consist of output points spaced $\frac{1}{2}^k$ frequency units apart and can be shown to be the same spectra that would be obtained from a circular autocorrelation of the input data block over the interval $2^k$. Also, any energy about the half sampling frequency will be folded around it and added to these output points by the alaising phenomenon. Thus, a binary pseudo-random sequence can be analyzed by the discrete Fourier Transform to achieve the result of FIG. 4 provided that 1. The pseudo-random noise sequence (or, as will be explained, the output test signal) is low pass filtered at less than 0.5 of the sampling or Fast Fourier Transform (FFT) frequency to remove any power which because of alaising would confuse the measure of power in the region below; and 2. The sampling interval of the digital data samples and the sequence bit interval of the pseudo-random noise sequence are synchronized so that the analysis is conducted over an integral number of noise periods according to the relation $$L(2^N-1)\Delta T_{seq} = 2^k \Delta T_{FFT}, \quad (3)$$

where L is an integer equal to the number of periods, and $\Delta T_{FFT}$ is the data sampling interval. Since $f_{seq} = 1/\Delta T_{seq}$ and $f_{FFT} = 1/\Delta T_{FFT}$, an alternative form of equation (3) is $$L(2^N-1)f_{FFT} = 2^k f_{seq}. \quad (4)$$

By choosing the sampling of FFT frequency in this manner, all but one of the spectral lines in the computed power spectra falls at the nulls of the FFT.

In the application of the foregoing theory to the frequency response measurement system illustrated in FIG. 5, $f_{seq}$ is the shift rate of the digital shift register sequence generator and $f_{FFT}$ is the sampling rate of the A-D converter which samples the analog sample output test signal. These frequencies are derived from and related to a master digital clock frequency, $f_M$, and to equation (4) as follows:

$$L(2^N-1)f_{FFT} = 2^k f_{seq} = f_M \quad (5)$$

In FIG. 5, a digital clock 14 with a prescribed frequency $f_M$ generates a master digital clock signal 15 from which is derived, by the process of division, both a sampling actuating signal and a sequence generator actuating signal with frequencies having a ratio as determined by equation (4). Thus, master clock signal 15 is fed to a first frequency divider 16 in which $f_M$ is divided by $2^k$ to generate an actuating signal or bit shift signal for pseudo-random sequence generator 11 having the frequency called for by equation (5). In parallel, master clock signal 15 is fed to a second frequency divider 17 in which $f_M$ is divided by L $(2^N-1)$ to thereby generate a sampling actuating signal for analog-digital converter 18 with a frequency given by the equations.

The binary periodic noise signal at the output of digital shift register sequence generator 11 in one embodiment of the method is fed directly to a low pass filter 19 with a cut-off frequency, $f_c$, as follows:

$$f_c = 0.45 \frac{f_M}{L(2^N-1)}. \quad (6)$$

In terms of the sampling or FFT frequency, as has been mentioned, $f_c = 0.45 f_{FFT}$. As has been discussed with regard to FIG. 4, the effect of low pass filtering the binary periodic noise signal is to retain the frequency components having a substantially equal amplitude. The filtered binary periodic noise signal is then applied to the system 20 under test to generate the output test signal. In analog-digital converter 18, the output test signal is sampled at a rate determined by the sample actuating signal, and the analog data samples so produced are converted to digital data samples and supplied to minicomputer 21. The minicomputer is preprogrammed with a Fast Fourier Transform power spectra program, or can be special purpose equipment such as is known in the art, with display of the computed results in an appropriate output device 22. The output device 22 is, for instance, an oscilloscope or teletype machine, and it may be preferable to use a display format in which only computed results outside of preset acceptable limits are displayed.

Low pass filtering the binary periodic noise signal before application to the system under test as depicted in full lines in FIG. 5 performs three functions and is the preferred method sequence for electrical test systems such as receivers, amplifiers, and filters. Elimination of inaccuracies in the power spectra estimates due to alaising has already been mentioned as has the fact that the closely spaced set of sine waves injected into the system under test are of approximately equal amplitude and do not differ greater than 3 dB. The third function is that filtering smooths the electrical signal so that there are no sharp edges and corners. The method also has application to the testing of mechanical systems, as for instance vibration analysis and measurement of mechanical impedance, and determination of the transfer function of machine tools. For mechanical systems the alternative sequence depicted in dashed lines in FIG. 5 is preferred, and involves applying the unfiltered binary periodic noise signal to the system 20' under test, and then low pass filtering the output test signal and, in turn, sampling the filtered output test signal. The measurement system may include electrical-mechanical and mechanical-electrical transducers at the test system input and output, but these are not illustrated. With the alternative arrangement, it is possible to apply a push-pull type signal to the mechanical system, which is often preferred, and it makes no difference if the output test signal is low pass filtered since the result is the same as in the converse (full line) arrangement.

A specific application of the frequency response measurement technique to the testing of radio receivers will clarify the method. In equation (4), let $L = 1$, $N = k = 9$, and make $f_{FFT} = 20{,}480$ Hz. In terms of the measurement system, the digital shift register has nine stages, a single period of the pseudo-random noise sequence is analyzed, and the data block on which power spectra computations are made has 512 samples. For this example, there is obtained a measurement of the frequency response from 80 Hz to 9,200 Hz consisting of 230 points spaced 40 Hz apart. For this system, the low pass filter cut-off frequency is about 9200 Hz, and the master clock frequency and shift rate of the digital shift register sequence generator are determined from equation (5). In some applications, such as in an automatic testing sytem, it may be advantageous to rescale the whole measurement system. This is accomplished in FIG. 5 by reducing the low pass filter cutoff frequency while at the same time proportionately reducing the master digital clock frequency. Also, rather than starting with the master digital clock frequency and dividing to derive the sampling rate of the A-D converter and shift rate of the digital shift register sequence generator, it is also possible to start with the shift rate and derive from it the sampling rate, or vice versa. Equation (4) gives the necessary multiplications and divisions, or vice versa, required if $f_{seq}$ or $f_{FFT}$ is the reference.

In summary, the method of high speed frequency response measurement herein described utilizes the properties of pseudo-random noise and the discrete Fourier Transform to inject simultaneously a closely spaced set of approximately equal amplitude sine waves into the system under test and separate their responses at the output. This achieves high resolution (250–1000 separate output points are not unreasonable) in the measurement while the test system must reach steady state as to only one input signal. There is no statistical uncertainty in the output except that caused by noise. Additional benefits are that the amount of special hardware required is minimal and that the input signal is well bounded.

While the invention has been particularly shown and described with reference to several preferred embodiments thereof, it will be understood by those skilled in the art that various changes in form and details may be made therein without departing from the spirit and scope of the invention.

The invention claimed is:

1. A method for high speed frequency response measurement by generating digital data samples from which the power spectra of an output test signal is computed by a Fast Fourier Transform technique, comprising the steps of deriving a binary sequence generator bit shift signal having a first frequency and also a sampling actuating signal having a second frequency, said first and second frequencies being selected to synchronize and achieve a predetermined ratio between the sequence bit interval and the sampling interval of an output test signal, supplying said bit shift signal to a binary sequence generator and producing at the output thereof a binary periodic noise signal representing the binary pseudo-random sequence with a period given by $(2^N - 1)\Delta T_{seq}$, where N is an integer and $\Delta T_{seq}$ is the sequence bit interval equal to the reciprocal of the first frequency, low pass filtering the binary periodic noise signal to retain frequency components having a substantially equal amplitude, applying the filtered binary periodic noise signal to a system under test to generate the output test signal, and sampling the output test signal at a rate determined by said sampling actuating signal and converting the analog data samples so produced to said digital data samples.

2. A method for high speed frequency response measurement by generating digital data samples from which the power spectra of a filtered output test signal is computed by a Fast Fourier Transform technique, comprising the steps of deriving a binary sequence generator bit shift signal having a first frequency and also a sampling actuating signal having a second frequency, said first and second frequencies being selected to synchronize and achieve a predetermined ratio between the sequence bit interval and the sampling interval or an output test signal, supplying said bit shift signal to a binary sequence generator and producing at the output thereof a binary pseudo-random sequence with a period given by $(2^N-1) \Delta T_{seq}$, where N is an integer and $\Delta T_{seq}$ is the sequence bit interval equal to the reciprocal of the first frequency.

applying the binary periodic noise signal to a system under test to generate an output test signal, low pass filtering the output test signal to retain frequency components having a substantially equal amplitude, and sampling the filtered output test signal at a rate determined by said sampling actuating signal and converting the analog data samples so produced to said digital data samples.

3. A method for high speed frequency response measurement by generating digital data samples from which the power spectra of an output test signal is computed by a Fast Fournier Transform technique, comprising the steps of processing a master digital clock signal having a first frequency to derive therefrom a sampling actuating signal having a second frequency and also derive a sequence generator actuating signal having a third frequency, said second and third frequencies being selected to achieve a predetermined ratio between the sampling rate of an output test signal and the shift rate of a sequence generator, supplying said sequence generator actuating signal to a digital shift register sequence generator and producing at the output thereof a binary periodic noise signal representing a binary pseudo-random sequence with a period given by $(2^N-1)\Delta T_{seq}$, where N is an integer and $\Delta T_{seq}$ is the sequence bit interval equal to the reciprocal of the third frequency, low pass filtering the binary periodic noise signal to retain frequency components having a substantially equal amplitude, applying the filtered binary periodic noise signal to a system under a test to generate the output test signal, and sampling the output test signal at a rate determined by said sampling actuating signal and converting the analog data samples so produced to said digital data samples.

4. The method according to claim 3 wherein the processing step comprises the steps of dividing the first frequency digital clock signal by the product $L(2^N-1)$, where L is an integer equal to the number of periods in the generated periodic noise signal, to thereby produce said sampling actuating signal, and also dividing the first frequency digital clock signal by 2, where k is an integer and $2^k$ is the total number of digital data samples, to thereby produce said sequence generator actuating signal.

5. A method for high speed frequency response measurement by generating digital data samples from which the power spectra of a filtered output test signal is computed by a Fast Fournier Transform technique, comprising the steps of processing master digital clock signal having a first frequency to derive therefrom a sampling actuating signal having a second frequency and also derive a sequence generator actuating signal having a third frequency, saod second and third frequencies being selected to achieve a predetermined ratio between the sampling rate of a filtered output signal and the shift rate of a sequence generator, supplying said sequence generator actuating signal to a digital shift register sequence generator and producing at the output thereof a binary periodic noise signal representing a binary pseudo-random sequence with a period given by $(2^N-1)\Delta T_{seq}$, where N is an integer and $\Delta T_{seq}$ is the sequence bit interval equal to the reciprocal of the third frequency, applying the binary noise signal to a system under test to generate an output test signal, low pass filtering the output test signal to retain frequency components having a substantially equal amplitude, and sampling the filtered output test signal at a rate determined by said sampling actuating signal and converting the analog data samples so produced to said digital data sampels.

6. The method according to claim 5 wherein the processing step comprises the steps of dividing the first frequency digital clock signal by the product $L(2^N-1)$, where L is an integer equal to the number of periods in the generated noise signal, to thereby produce said sampling actuating signal, and also dividing the first frequency digital clock signal by $2^k$, where k is an integer and $2^k$ is the total number of digital data samples, to thereby produce said sequence generator actuating signal.

* * * * *